United States Patent [19]

Shibata

[11] Patent Number: 5,585,737
[45] Date of Patent: Dec. 17, 1996

[54] SEMICONDUCTOR WAFER PROBING METHOD INCLUDING ARRANGING INDEX REGIONS THAT INCLUDE ALL CHIPS AND MINIMIZE THE OCCURRENCE OF NON-CONTACT BETWEEN A CHIP AND A PROBE NEEDLE DURING CHIP VERIFICATION

[75] Inventor: Junichiro Shibata, Urawa, Japan

[73] Assignee: Tokyo Electron Kabushiki Kaisha, Tokyo-to, Japan

[21] Appl. No.: 361,384

[22] Filed: Dec. 22, 1994

[30] Foreign Application Priority Data

Dec. 27, 1993 [JP] Japan .................................. 5-353340

[51] Int. Cl.$^6$ .................................................. G01R 31/02
[52] U.S. Cl. .................................................. 324/754
[58] Field of Search ................................. 324/754, 158.1

[56] References Cited

U.S. PATENT DOCUMENTS 4,799,009  1/1989  Tada et al. ................................ 324/756
4,985,676  1/1991  Karasawa ................................. 324/754
5,336,992  8/1994  Saito et al. ............................... 324/754

*Primary Examiner*—Ernest F. Karlsen
*Assistant Examiner*—Russell M. Kobert
*Attorney, Agent, or Firm*—Beveridge, Degrandi, Weilacher & Young, L.L.P.

[57] ABSTRACT

A semiconductor wafer probing method for reducing the number of times of an "indexing" or wafer transfer operation and improving verification efficiency. In the semiconductor wafer probing method, a probe card has a first plurality of upright probe needles (e.g. sixteen) corresponding to chips (e.g. eight) arranged in a vertical or "row" direction and chips (e.g. 2) arranged in a horizontal or "column" direction. A first plurality of chips that can be verified by such a probe card is defined as an index region. A (second) plurality of index regions are arranged so as to minimize the number of occurrences where the probe needles will not have a chip to contact as the wafer and needles are moved relative to each other. Such (second) plurality of index regions is defined as a contact region 23.

10 Claims, 16 Drawing Sheets

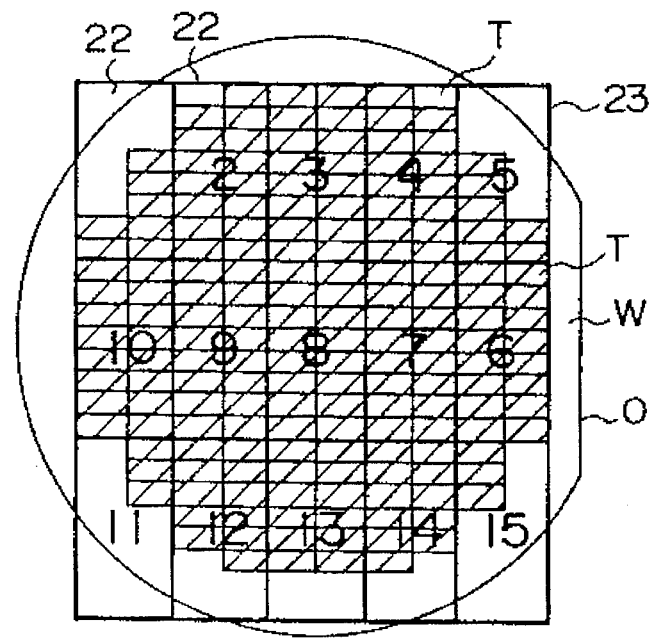
F I G. 1A

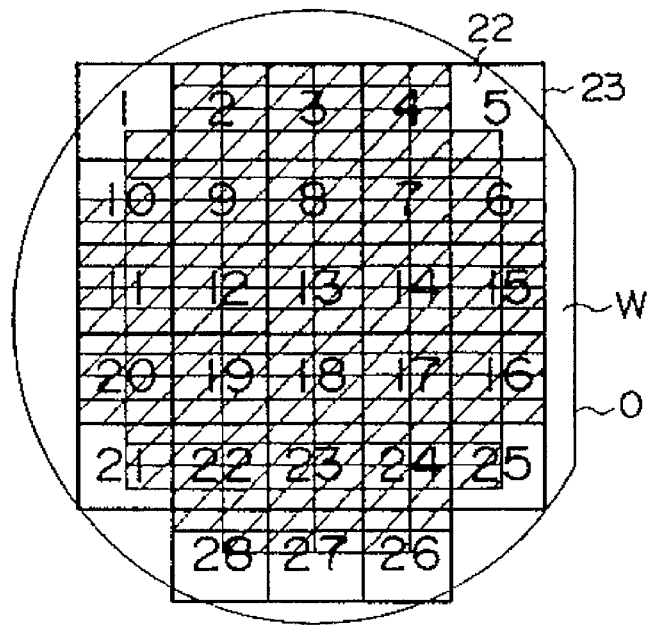
F I G. 2A

SEMICONDUCTOR WAFER PROBING METHOD INCLUDING ARRANGING INDEX REGIONS THAT INCLUDE ALL CHIPS AND MINIMIZE THE OCCURRENCE OF NON-CONTACT BETWEEN A CHIP AND A PROBE NEEDLE DURING CHIP VERIFICATION

BACKGROUND OF THE INVENTION

1. Field of the Invention

The present invention relates to a semiconductor wafer probing method.

2. Description of the Related Art

When many chips are formed on a semiconductor wafer in a semiconductor fabricating process, electric characteristics of these chips should be verified on the semiconductor wafer so as to screen defective chips. This verification is performed by a probe apparatus. The chips on the semiconductor wafer are verified by the probe apparatus in the following manner. Probe needles of the probe apparatus are contacted to electrode pads of chips on the semiconductor wafer. Predetermined voltages are applied to the electrode pads through the probe needles so as to perform electric tests such as chip connection test. The basic electric characteristics of each chip are tested by a tester.

In the conventional probe apparatus, as shown in FIGS. 17A and 17B, edge portions of a plurality of probe needles 31 are secured at a periphery of a center opening portion of a probe card (not shown) by a synthetic resin or the like. In other words, the edge portions are formed in an overhang shape. Thus, when eight chips T are verified by inclined probe needles shown in FIG. 17A at the same time, a probe card having two rows of overhand probe needles that face each other is used. In addition, two rows of electrode pads of chips T are disposed in such a manner that two electrode pads are arranged in vertical direction and four electrode pads are arranged in horizontal direction. This electrode pad arrangement is defined as one index region. Thereafter, all the chips T on the semiconductor wafer are divided into the index regions. The probe card is indexed corresponding to the index regions so as to verify all the chips T.

However, since the overhang type needles 31 are used in the conventional probe apparatus, when for example eight chips T are verified at the same time, as shown in FIG. 17C, every (2×4) chips are successively verified at the same time as one indexing amount. When all the chips T on the semiconductor wafer are successively verified, as shown in FIG. 2B, the number of chips T to be verified at the right edge of the semiconductor wafer W is small. Thus, in many index regions, the chip area is narrower than the non-chip area. Consequently, the number of times of the indexing operation increases, thereby deteriorating the verification efficiency and lowering the throughput. In addition, since such overhang type probe needles 31 are inclined and long, while the indexing operation is being repeated, the probe needles 31 are repeatedly pressured by the semiconductor wafer or the probe needles are caught in uneven portions on the semiconductor wafer. Thus, the probe needles 31 will be pressured and deformed. Consequently, since the probe needles 31 cannot properly contact the electrode pads P, the probe card should be replaced with a good one, thereby further lowering the throughput.

To solve such a problem, as shown in FIG. 18C, chips T are disposed in such a manner that four chips T are arranged in the vertical direction of one index region and two chips T are arranged in the horizontal direction thereof so as to form the index region in nearly a square shape corresponding to the shape of the semiconductor wafer. Thus, as shown in FIG. 2A, the number of times of the indexing operation can be reduced. However, in this case, since there are four rows of the electrode pads P, two outer rows of the electrode pads P and two inner rows thereof should be contacted to the overhang type probe needles 31 at the same time. To do that, as shown in FIG. 18A, the probe card should be constructed in such a manner that two rows of probe needles are disposed on a securing portion 30 so that the probe needles contact the inner electrode pads (electrode pads on the left side of FIGS. 18A and 18B). In addition, the upper row of the probe needles 31 should be longer than the lower row of the probe needles 31. Thus, the upper row of the probe needles 31 is more easily deformed than the lower row of the probe needles 32. Consequently, when the probe needles 32 are pressured by the semiconductor wafer, as shown in FIG. 18B, the upper row of the probe needles 32 are deformed upward and the probe needles 32 float from the electrode pads P. Thus, the probe card should be replaced, thereby further lowering the throughput.

SUMMARY OF THE INVENTION

An object of the present invention is to provide a semiconductor wafer probing method that allows the number of times of performing the indexing operation to be reduced and the verification efficiency to be improved.

A first aspect of the present invention is a semiconductor wafer probing method for contacting a plurality of probe needles of a probe card to a plurality of electrode pads of a plurality of chips on a semiconductor wafer so as to verify electrical characteristics of the chips, comprising the steps of preparing a multi-probe card having a plurality of probe needles corresponding to a plurality of chips that are disposed in such a manner that an even number of chips are successively arranged in both vertical (row) and horizontal (column) directions, the number of chips in at least one of the vertical and horizontal directions being at least four, assigning a region verified by the multi-probe card at the same time as one index region, arranging a plurality of the index regions so that the index regions cover all the chips on the semiconductor wafer and the area of the index regions that is outside the semiconductor wafer becomes minimum and defining the area as a contact region, and successively indexing the semiconductor wafer to each index region of the contact region.

A second aspect of the present invention is a semiconductor wafer probing method for contacting a plurality of probe needles of a probe card to a plurality of electrode pads of a plurality of chips on a semiconductor wafer at the same time so as to verify electric characteristics of the chips, comprising the steps of preparing a multi-probe card having a plurality of probe needles corresponding to a plurality of chips that are disposed in such a manner that an even number of chips are successively arranged in both vertical and horizontal directions, the number of chips in at least one of the vertical and horizontal directions being at least four, causing a display unit of a computer to display the semiconductor wafer and all the chips, arranging a plurality of the index regions so that the index regions cover all the chips on the semiconductor wafer and the area of the index regions that is outside the semiconductor wafer becomes minimum and defining the area as a contact region on the display unit, and successively indexing the semiconductor wafer to each index region of the contact region.

As described above, according to the first aspect of the present invention, a probe card having a plurality of probe needles corresponding to a plurality of chips that are disposed in such a manner that an even number of chips are successively arranged in both vertical and horizontal directions is used. The number of chips in at least one of the vertical and horizontal directions is at least four. A region verified by the multi-probe card at the same time is defined as one index region. A plurality of the index regions are arranged so that the index regions cover all the chips on the semiconductor wafer and the area of the index regions that is outside the semiconductor wafer becomes minimum. The area is defined as a contact region. The semiconductor wafer is successively indexed to each index region of the contact region. Thus, the semiconductor wafer probing method for reducing the number of times of indexing operation and improving the verification efficiency can be provided.

According to the second aspect of the present invention, since the minimum contact region of the multi-probe card is assigned while the operator is observing the display portion of the computer, the semiconductor wafer probing method for assigning the minimum contact region that allows the number of times of indexing operation and the number of non-contacted chips to be reduced and the verification efficiency to be improved can be provided.

These and other objects, features and advantages of the present invention will become more apparent in light of the following detailed description of a best mode embodiment thereof, as illustrated in the accompanying drawings.

BRIEF DESCRIPTION OF DRAWINGS

FIGS. 1A and 1B showing methods for verifying every 16 chips on a semiconductor wafer at the same time, FIG. 1A being a plan view showing a verifying order of the chips on the semiconductor wafer in a semiconductor wafer probing method according to an embodiment of the present invention, FIG. 1B being a plan view showing a verifying order of the chips on the semiconductor wafer in a conventional semiconductor wafer probing method;

FIGS. 2A and 2B showing methods for verifying every eight chips on the semiconductor wafer at the same time, FIG. 2A being a plan view showing a verifying order of the chips on the semiconductor wafer in a semiconductor wafer probing method according to an embodiment of the present invention, FIG. 2B being a plan view showing a verifying order of the chips on the semiconductor wafer in a conventional semiconductor wafer probing method;

DESCRIPTION OF PREFERRED EMBODIMENTS

Next, with reference to FIGS. 1 to 16, embodiments of the present invention will be described.

According to the semiconductor wafer probing method according to the present invention, all chips on a semiconductor wafer can be verified in the order shown in FIGS. 1 and 2. When the probing method of the present invention is performed, a probe card shown in FIGS. 3 and 4 can be preferably used.

Figure 3:
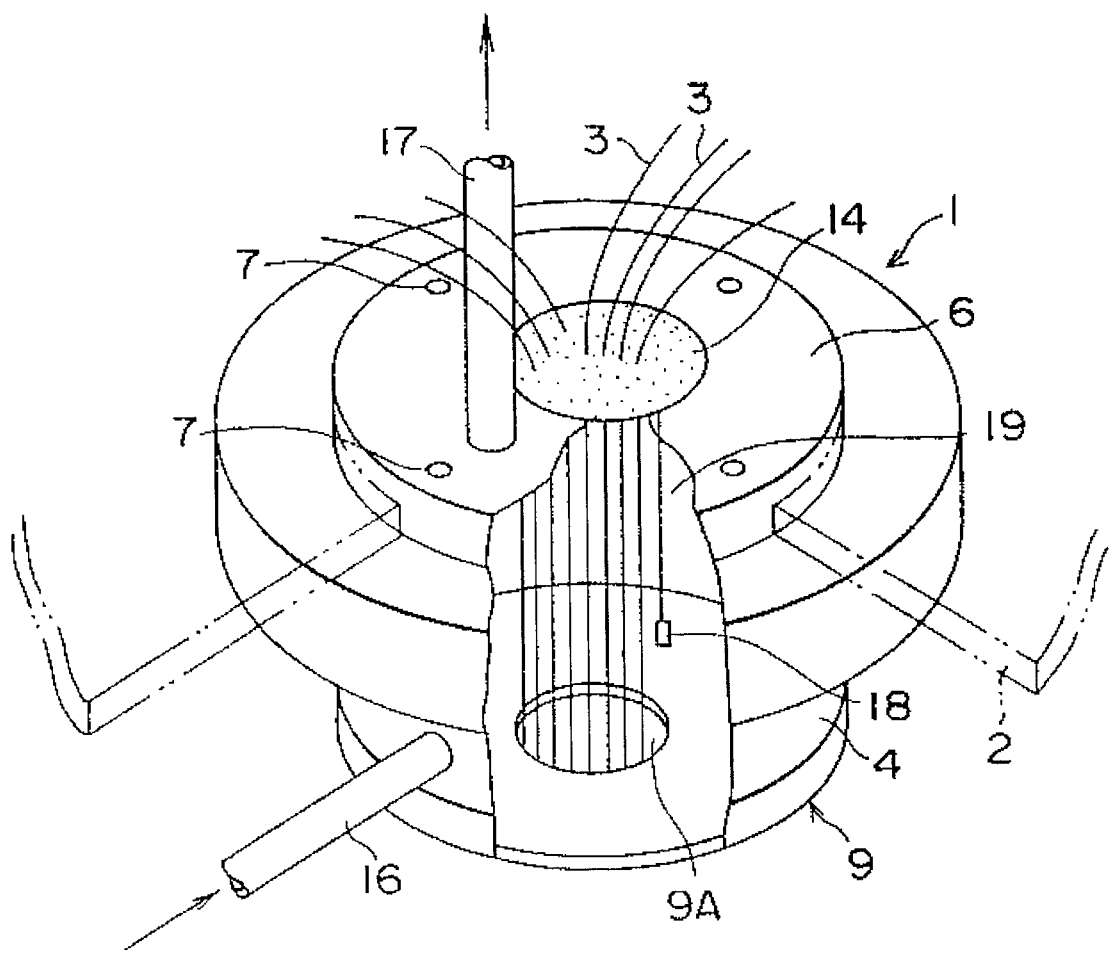
FIG. 3 is a perspective view showing a probe card of a probe apparatus suitably used in the semiconductor wafer probing method according to the present invention.
Figure 4:
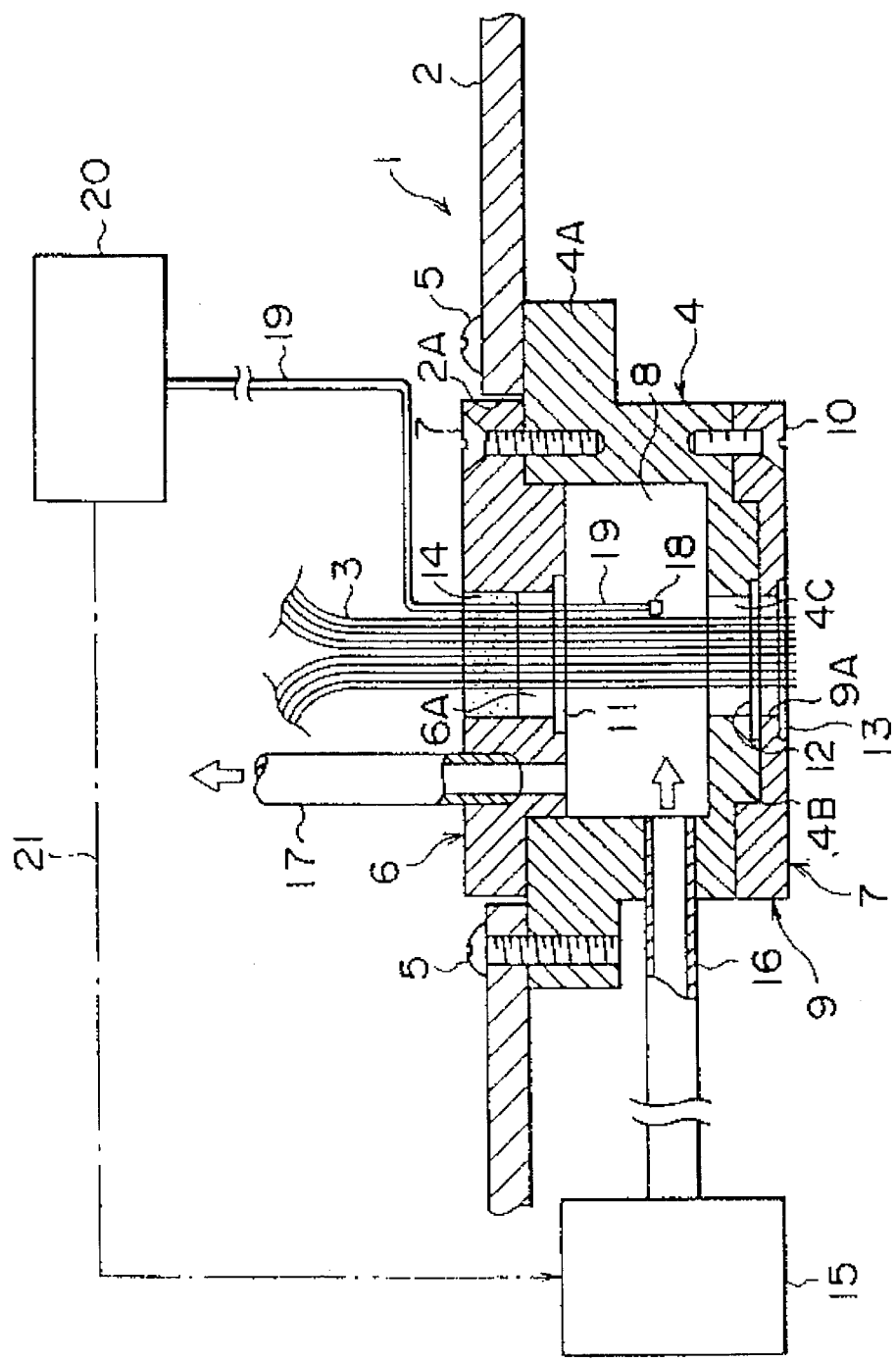
FIG. 4 is a sectional view showing the probe card of FIG. 3
Figure 5:
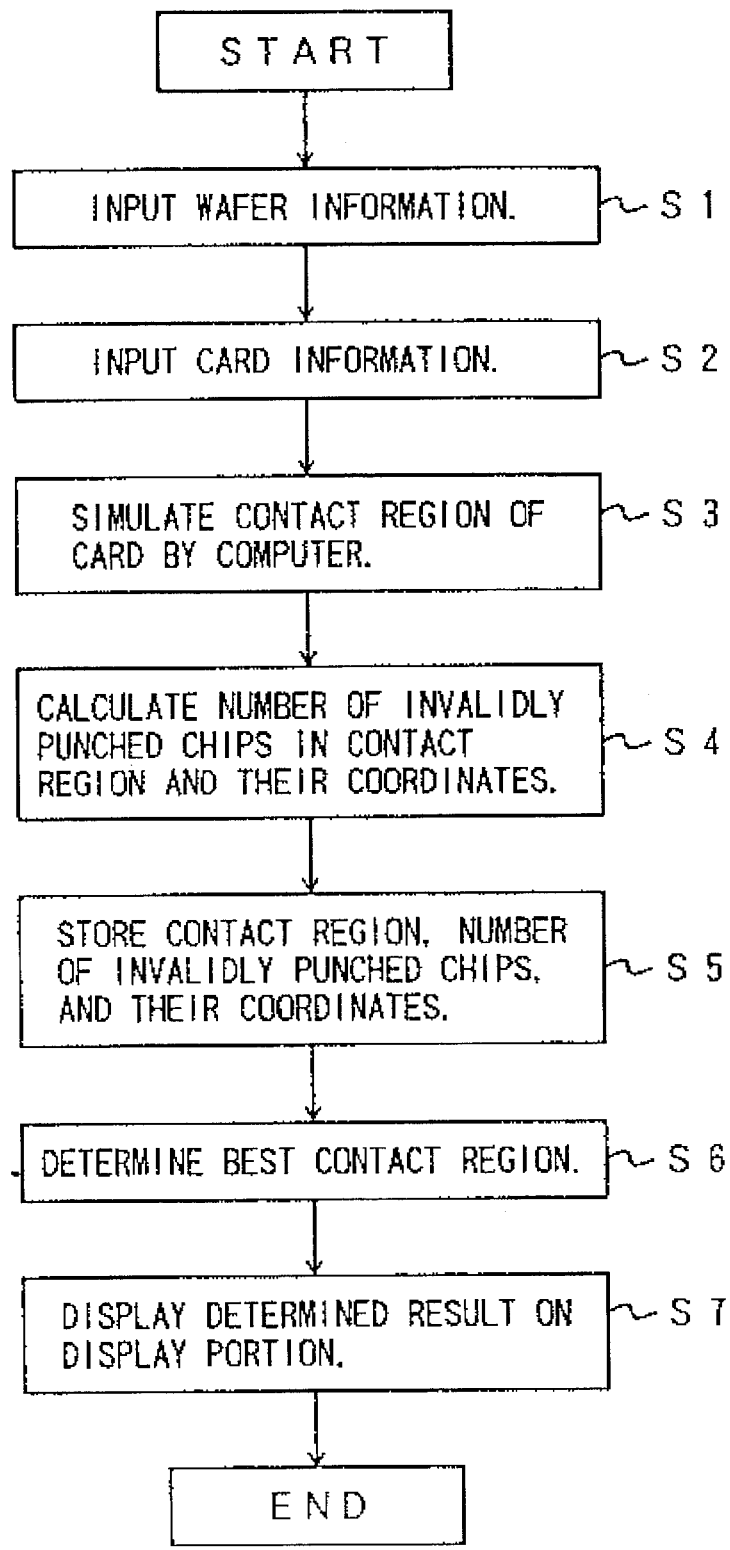
FIG. 5 is a flow chart showing the semiconductor wafer probing method according to the embodiment of the present invention.

Before explaining the semiconductor wafer probing method according to the present invention, with reference to FIGS. 3 and 4, the preferable probe card according to the embodiment of the present invention will be described. As shown in these drawings, the probe card 1 comprises a printed circuit board 2 and many probe needles 3. The printed circuit board 2 has an opening portion 2A at the center. The probe needles 3 are connected to the front surface of the printed circuit board 2 through the center opening portion 2A. The probe card 1 is secured to a securing head of a probe apparatus (not shown). A cup-shaped intermediate block 4 is secured to the rear surface of the printed circuit board 2 by screws 5. The intermediate block 4 has a flange portion 4A.

An upper block 6 is secured to the upper surface of the flange portion 4A of the intermediate block 4 by screws 7. The upper block 6 closes the center opening portion 2A of the printed circuit board 2 and the upper opening portion of the intermediate block 4. A cooling chamber 8 (which will be described later) is formed in the intermediate block 4. A thick wall portion 4B is formed on the lower surface of the intermediate block 4. The diameter of the thick wall portion 4B is smaller than the diameter of the intermediate block 4.

A holding block 9 that vertically holds the probe needles 3 fits into the thick wall portion 4B. The holding block 9 is secured on the lower surface of the intermediate block 4 by screws 10. An opening portion 6A is formed on the bottom surface of the upper block 6. An opening portion 4C is formed on the bottom surface of the intermediate block 4. An opening portion 9A is formed at the center of the holding block 9. The probe needles 3 pass through the opening portions 6A, 4C, and 9A.

The probe needles 3 are vertically held by guide plates 11, 12, and 13 disposed at the opening portions 6a, 4C, and 9A, respectively. In other words, the guide plates 11, 12, and 13 have small holes corresponding to the probe needles 3. The small holes guide the probe needles 3 from the upper surface of the probe card 1 to the center of the lower surface thereof. In addition, the small holes vertically hold the probe needles 3. Moreover, the probe needles 3 are secured at the opening portion 6A of the upper block 6 by synthetic resin 14 such as epoxy resin. The lower edge portions of the probe needles 3 are arranged so that they contact electrode pads (not shown) of a plurality of (for example, 8×2) chips T to be verified. The probe card 1 has probe needles 3 corresponding to the electrode pads of the (8×2) chips T shown in FIG. 14.

A conduit pipe 16 is connected from a gas supply device 15 to a side surface of the intermediate block 4 so as to supply cooling gas such as compressed air or compressed nitrogen to the cooling chamber 8. In addition, another conduit pipe 17 is connected to a portion in the vicinity of the opening portion of the upper block 6 so as to exhaust the cooling gas in the cooling chamber 8 to the outside. Consequently, the cooling gas is supplied from the gas supply device 15 to the cooing chamber 8 of the probe card 1 through the conduit pipe 16. The waste gas in the cooling chamber 8 is exhausted to the outside through the conduit pipe 17. A thermocouple 18 is disposed in the cooling chamber 8. The thermocouple 18 detects the temperature in the cooling chamber 8, namely the temperature of the probe needles 3. The thermocouple 18 is connected to a cooling chamber monitor control device 20 through a cable 19. The cooling chamber monitor control device 20 sends an electric signal 21 to the gas supply device 15 corresponding to the temperature in the cooling chamber 8 so as to control the supply of the cooling gas.

Next, with reference to FIGS. 1 and 2, a semiconductor wafer probing method according to the embodiment according to the present invention will be described. In the semiconductor wafer probing method, electric characteristics of chips T on a semiconductor wafer W are verified by the probe card 1.

The probe card according to this embodiment has a plurality of upright probe needles 3 corresponding to electrode pads of a plurality of (for example, 8×2 as shown in FIG. 1A) chips T disposed in such a manner that eight chips are arranged in one of vertical (row) and horizontal directions (in this embodiment, vertical direction) of the semiconductor wafer W and two chips are arranged in the other direction thereof. When the chips T on the semiconductor wafer W are verified by the probe card 1, as shown in FIG. 1A, an orientation flat O of the probe card 1 is designated in the vertical direction. A region of (8×2) chips T that is verified by the probe card 1 is defined as one index region 22. A plurality of index regions 22 are disposed on the semiconductor wafer W so that the index regions 22 cover all the chips T on the semiconductor wafer W. The minimum area of the index regions 22 that cover all the chips T is defined as a contact region 23. In this example, the contact region 23 is formed of 15 index regions (1) to (15). The index regions (1) to (15) are disposed in such a manner that they are formed in the shortest distance. In other words, as shown in FIG. 1A, the first index region (1) starts at the upper left edge of the contact region 23 and the last index region (15) ends at the lower right edge thereof. The index regions (1) to (15) are defined as the indexing order. The index regions 22, the contact region 23, and the indexing order are pre-registered in a control device (not shown).

While a semiconductor wafer (W) holding table (not shown) is being made to travel corresponding to the indexing order, the probe needles 3 of the probe card 1 are contacted to the electrode pads of 16 chips T in each index region 22 on the semiconductor wafer W. By repeating this operation 15 times, all the chips T on the semiconductor wafer W can be verified.

Figure 1B:
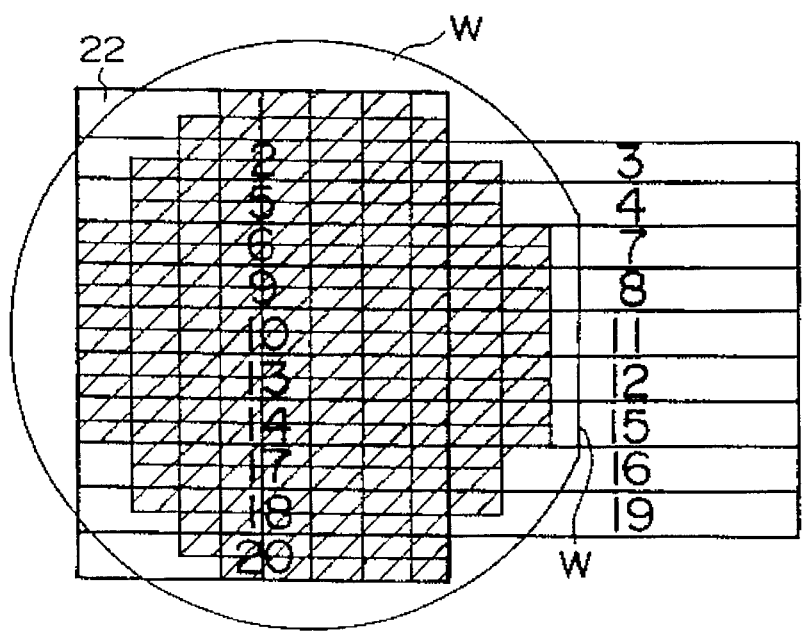

However, in a probing method using a conventional probe card, as shown in FIG. 1B, the probe card should verify chips T that are disposed in such a manner that two chips are arranged in vertical direction and eight chips are arranged in horizontal direction. Thus, as shown in FIG. 1B, the indexing operation should be performed 20 times. In addition, in the conventional probing method, in the index regions on the right side of the semiconductor wafer W, the number of probe needles that contact chips to be verified is much smaller than the number of probe needles that do not contact chips. Thus, it is clear that the verification efficiency of the conventional probing method is very low.

As described above, according to this embodiment, the number of times of the indexing operation is smaller than that of the probing method using the conventional probe card by five. Thus, the number of times of indexing operation can be reduced by 25%. Consequently, the verification efficiency can be correspondingly improved and the verification cost can be reduced. In addition, according to this embodiment, the upright probe needles 3 can be contacted to a plurality of chips T arranged in any shape so as to verify them at the same time. Moreover, due to the construction of the upright probe needles 3, they can be much suppressed from being deformed and prevented from being displaced from the electrode pads, thereby improving the verification accuracy. As a result, since the life of the probe needles 3 is much prolonged, the number of times of replacement of the probe card 1 can be reduced, thereby much reducing the verification cost.

Figure 2B:
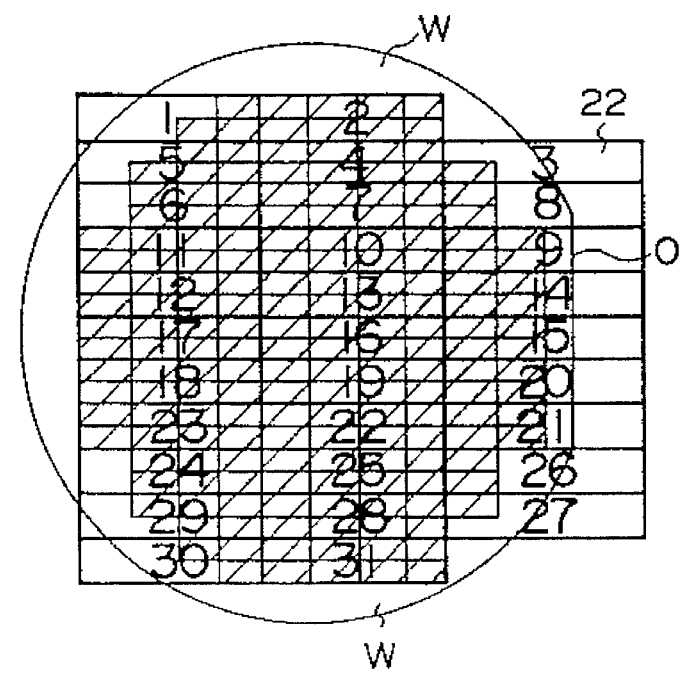

FIG. 2A is a plan view showing the case that (4×2) chips T are verified at the same time using the semiconductor wafer probing method according to the present invention. In this case, all chips T on a semiconductor wafer W can be verified by repeating the indexing operation 28 times. On the other hand, in the conventional method, as shown in FIG. 2B, to verify the same chips T on the semiconductor wafer W, it is necessary to perform the indexing operation 31 times. Thus, according to this embodiment, the number of times of the indexing operation can be reduced by 10% in comparison with that of the conventional method. In addition, according to this embodiment, the same effects as the above-described embodiment can be expected.

In the above description, the multi-probe card 1 that can verify 16 or eight chips T at the same time was used. However, the number of chips to be verified at the same time (hereinafter this number is referred to as multi-number) and the minimum contact region of the multi-probe card 1 are not predetermined. Instead, the multi-number and the minimum contact region can be determined by a computer. When a computer is used, as shown in a flow chart of FIG. 5, wafer information (such as a wafer size and orientation flat direction) and chip information (such as horizontal and vertical lengths (x, y)) are input (at step S1). Thereafter, card information of the multi-probe card (such as the multi-number and the chip arrangement) is input (at step S2). After that, the contact region of the multi-probe card against the semiconductor wafer is simulated by the computer a plurality of times (at step S3). The number of non-contacted chips (that are disposed outside the semiconductor wafer and thereby not contacted to the multi-probe card) and the coordinates thereof are calculated corresponding to the simulated results (at step S4). The calculated results are stored in the computer (at step S5). It is determined whether or not the number of times of performing the indexing operation and the number of non-contacted chips are correct (at step S6). A better probing method is determined and displayed on a display portion (at step S7). After the probing method has been determined by the computer, the semiconductor wafer W is probed by the probing apparatus.

When the contact region of the multi-probe card is simulated by the computer, as will be described later, there are three simulating methods that are "automatic setting mode", "optimal setting mode", and "free setting mode". The operator can select one of these modes corresponding to the wafer information, chip information, and card information. When the contact region is defined in the semiconductor wafer as in the above-described embodiment, the "free setting mode" is used to simulate the contact region as will be described later. When the multi-number of the multi-probe card 1 is 16 or 8, the "free setting mode" can be most effectively used. Next, with reference to FIGS. 6 to 16, the simulation of the contact region of the multi-probe card 1 shown in FIG. 1A will be described.

Figure 6:
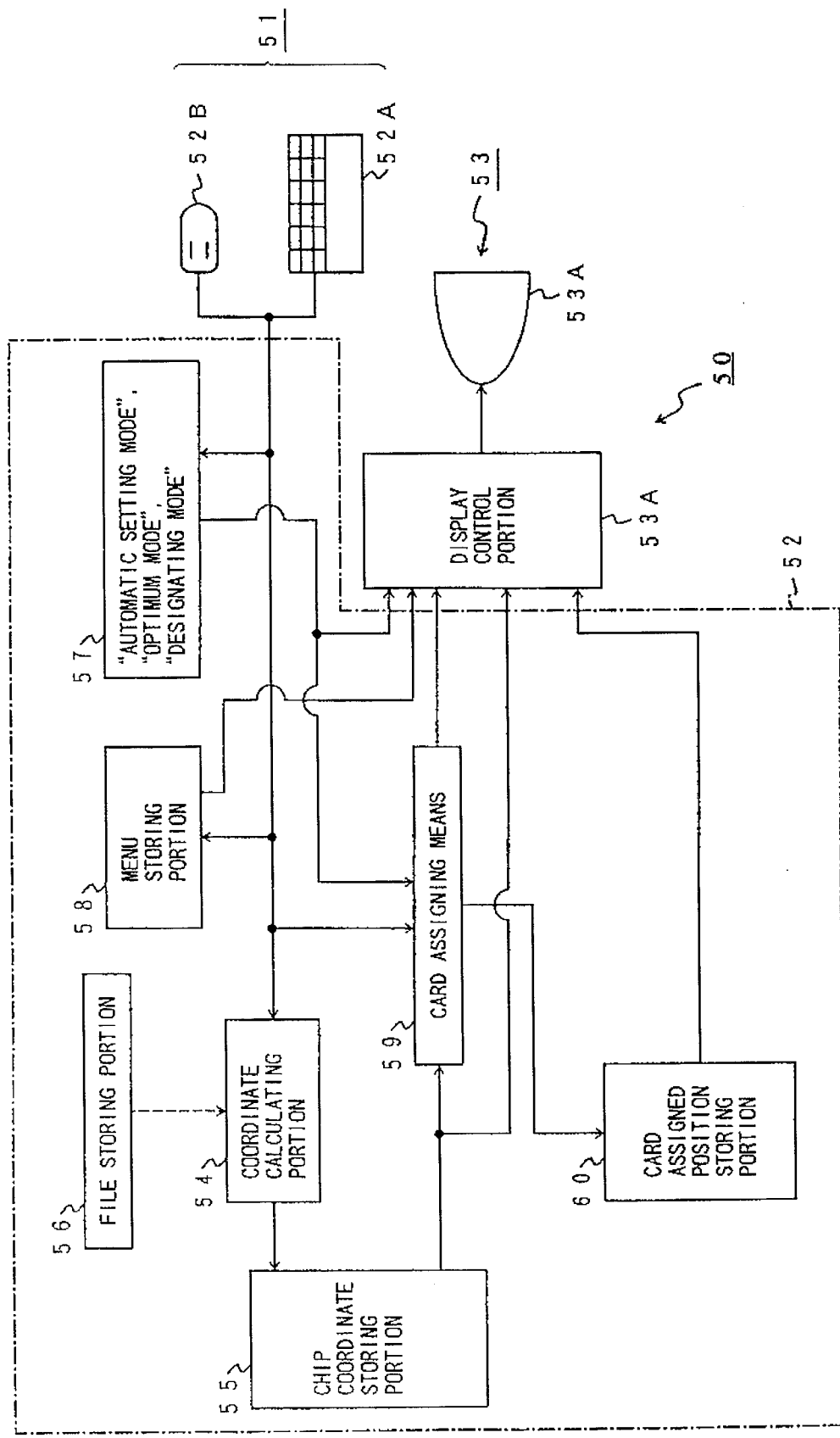
FIG. 6 is a block diagram showing principal portions of a computer used in the semiconductor wafer probing method according to the present invention.
Figure 16:
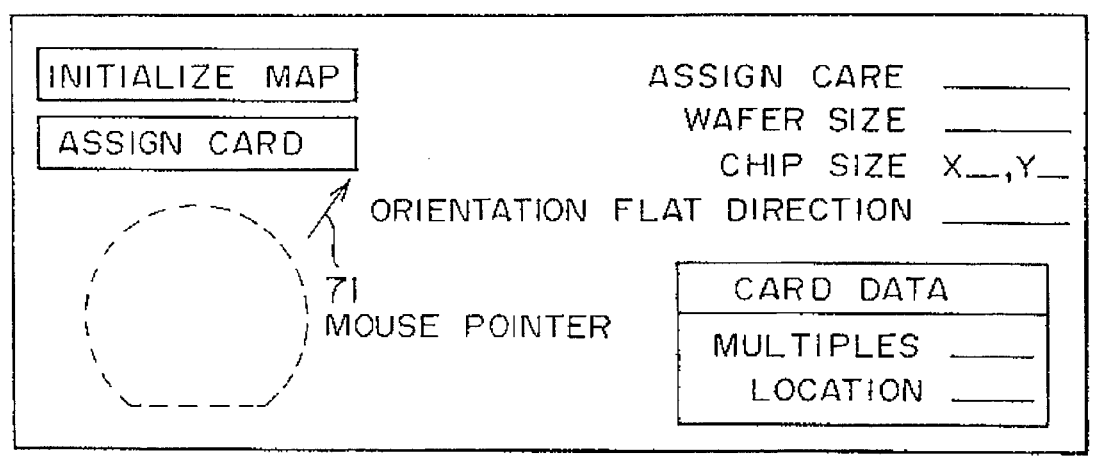
FIG. 16 is a schematic diagram showing an initial screen of the display portion.
Figure 17A:
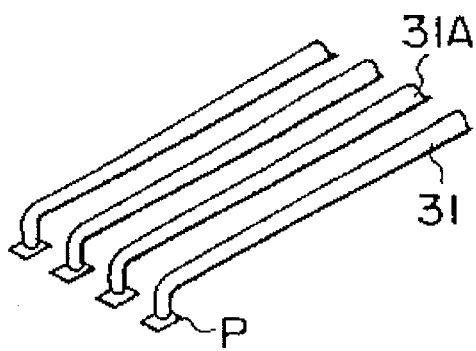
FIGS. 17A, 17B, and 17C showing part of probe needles of a conventional probe card and an arrangement of chips verified by the probe card, FIG. 17A being a perspective view showing part of normal probe needles, FIG. 17B being a perspective view showing part of deformed probe needles, FIG. 17C being a plan view showing the arrangement of chips verified by the probe needles of FIG. 17A.
Figure 17B:
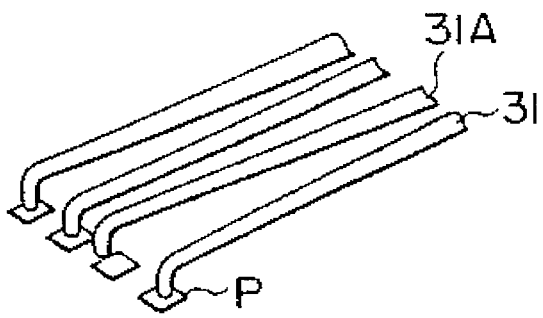
Figure 17C:
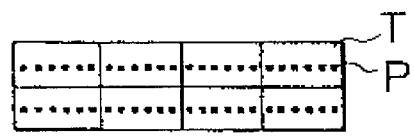
Figure 18A:
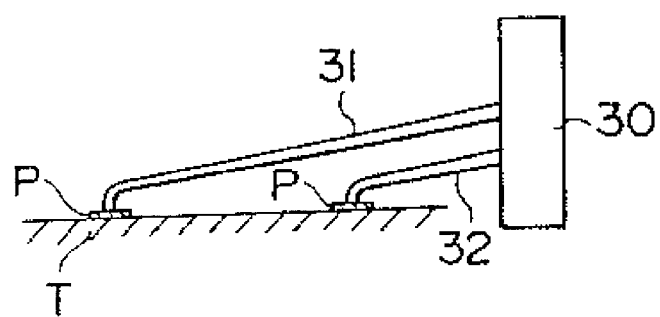
FIGS. 18A, 18B, and 18C showing part of probe needles of another conventional probe card and the arrangement of chips verified by the probe card, FIG. 18A being a schematic diagram showing part of normal probe needles, FIG. 18B being a schematic diagram showing part of deformed probe needles, FIG. 18C being a plan view showing the arrangement of chips verified by the probe needles of FIG. 18A.
Figure 18B:
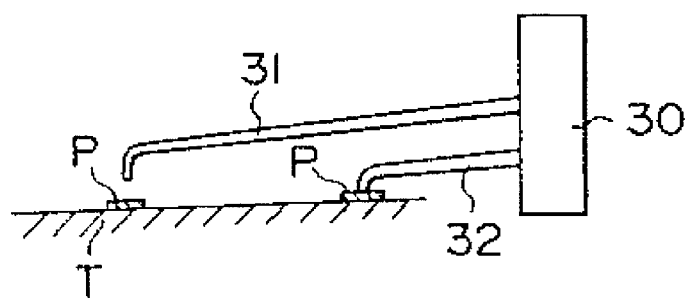
Figure 18C:
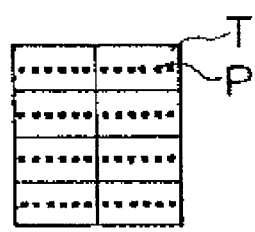

In this embodiment, referring to FIG. 6, reference numeral 50 is a computer. The computer 50 comprises an input means 51, a card assigning device 52, and a display means 53. The input means 51 inputs data such as wafer information, chip information, and card information. The card assigning device 52 assigns the index regions of the multi-probe card on the semiconductor wafer corresponding to the wafer information and the card information received from the input means 51. The display means 53 displays images of a semiconductor wafer and chips and numeric data with which the card assigning device 52 assigns the index regions. The card assigning device 52 comprises a coordinate calculating means 54, a chip coordinate storing portion 55, a file storing portion 56, a card assigning mode storing portion 57, a menu storing portion 58, a card assigning means 59, and a card assigned position storing portion 60. The input means 51 comprises for example a keyboard 51A and a mouse 51B. The display means 53 comprises a display portion 53A and a display control portion 53B. The display portion 53A is for example an LCD or a CRT, which displays graphics information or the like. The display control portion 53B controls the display information of the display portion 53A. As shown in FIG. 16, the display means 53 displays graphics of a semiconductor wafer and chips and text of wafer information and card information on the display portion 53A corresponding the input of the input means 51 as shown in FIG. 16.

Figure 14A:
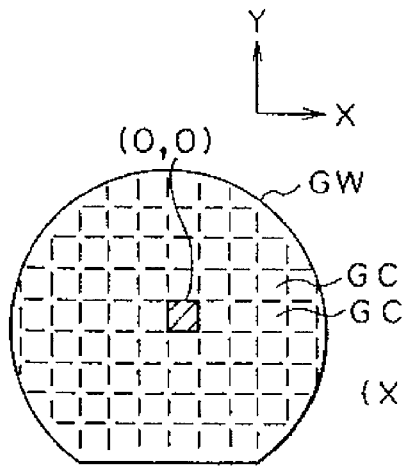
FIGS. 14A, 14B, 14C, 14D, and 14E are schematic diagrams showing graphic displays on a display portion in the assigning operation of the multi-probe card.

The coordinate calculating means 54 automatically arranges square images of chips on an image of a semiconductor wafer corresponding to the wafer information and the chip information that are input from the input means 51 and assigns position coordinates to each chip. The chip coordinate storing portion 55 is composed of a RAM or the like. The chip coordinate storing portion 55 stores the relation of the chips and their coordinates calculated by the coordinate calculating means 54. The information stored in the chip coordinate storing portion 54 is displayed in graphics as a wafer map through the display control portion 54B. The wafer map is displayed as shown in FIG. 14A. The file storing portion 56 is composed of a ROM or the like and connected to the coordinate calculating means 54. The file storing portion 56 pre-registers information of wafer information, chip information, card information, and so forth. Thus, the coordinate calculating means 54 reads information stored in the file storing portion 54, performs the above-described calculating process corresponding to the received information, and displays graphics of a wafer map corresponding to the calculated results on the display portion 53A.

The card assigning mode storing portion 57 is composed of a storing device such as a ROM. The card assigning mode storing portion 57 pre-stores for example three modes that are "automatic assigning mode", "optimal assigning mode", and "free assigning mode". The operator can select a desired mode from these modes. In the automatic assigning mode, the contact region is automatically assigned so that the upper and lower portions and the left and right portions of the semiconductor wafer are symmetrically contacted by the multi-probe card. In the optimal assigning mode, the contact region is automatically assigned so that the number of times of the indexing operation of the multi-probe card becomes minimum. In the free assigning mode, the operator can freely assign the contact region of the multi-probe card by moving the contact position with the cursor moving keys of the keyboard 31A or the mouse 31B.

The menu storing portion 58 stores various operation menus necessary for operating the computer 50, map initializing menus necessary for setting measurement conditions, card assigning menus, and so forth. The items of the menus can be increased or decreased when necessary. When "INITIALIZE MAP." displayed on the display portion 53A shown in FIG. 52B is selected by the mouse 52B, all chips on a semiconductor wafer are tested. When "ASSIGN CARD." is selected, the "card assigning mode" is executed.

The card assigning means 59 assigns the contact region of the chips on the semiconductor wafer against the multi-probe card corresponding to the information stored in the chip coordinate storing portion 55, the information stored in the card assigning mode storing portion 57, and the command received from the input means 51. The card assigning means 59 comprises an automatic assigning portion shown in FIG. 7, an optimal assigning portion 62 shown in FIG. 8, and a free assigning portion 63 shown in FIG. 9.

Figure 7:
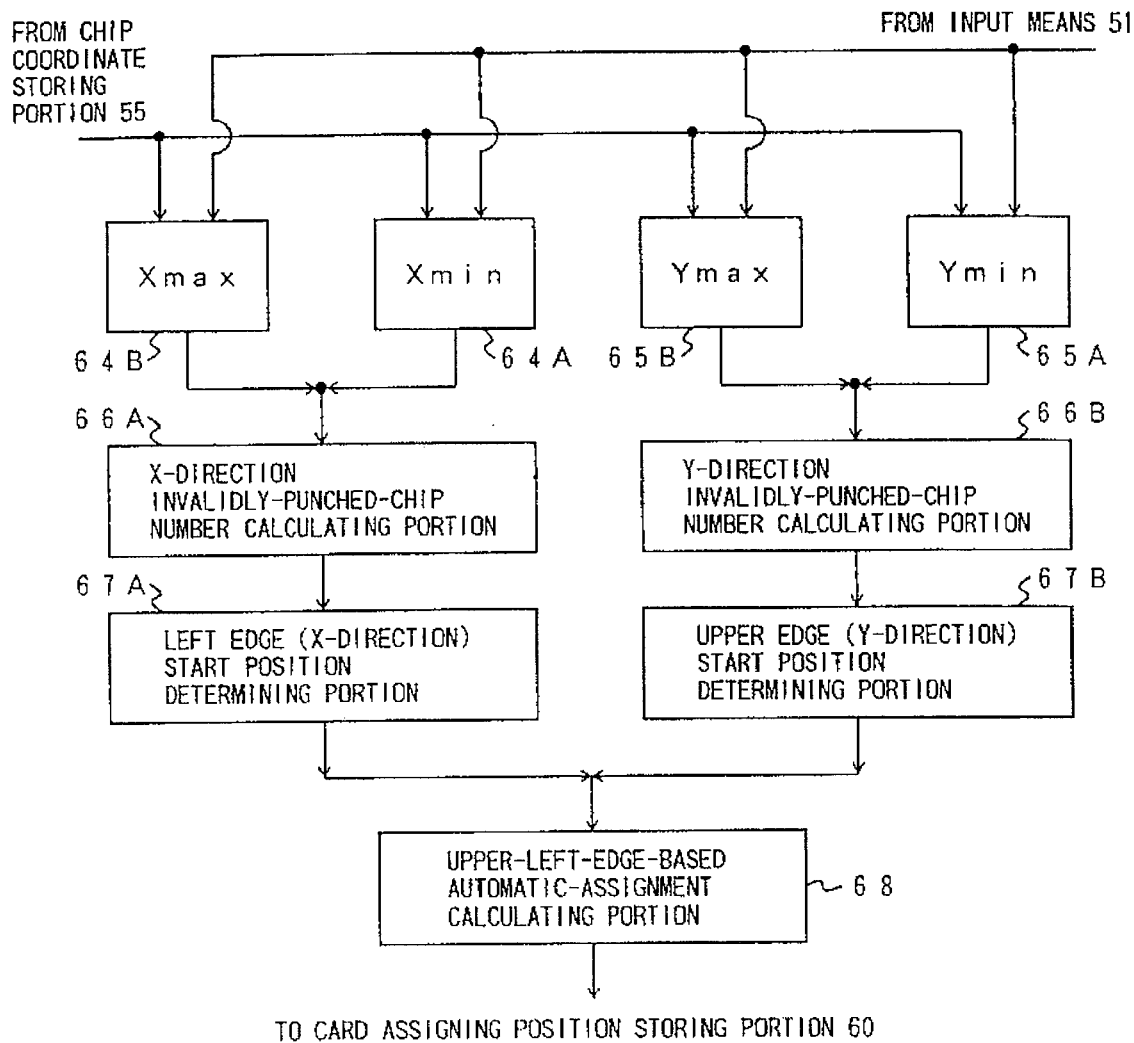
FIG. 7 is a block diagram showing an automatic assigning portion of the computer of FIG. 6.
Figure 14B:
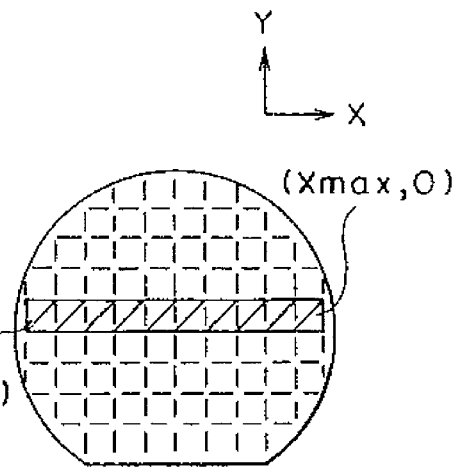
Figure 15A:
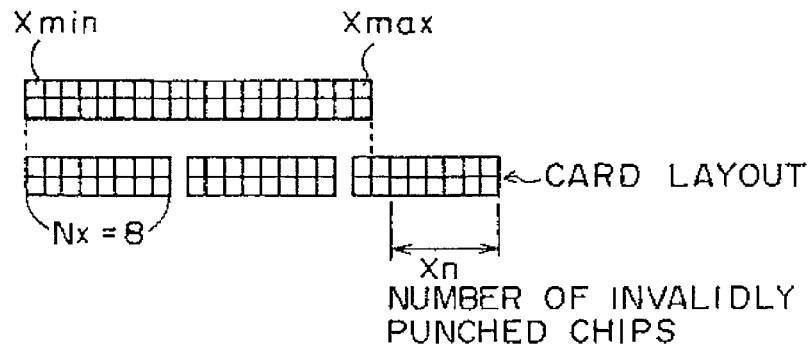
FIGS. 15A to 15B are schematic diagrams showing part of a calculating process in the assigning operation of the multi-probe card.
Figure 15B:
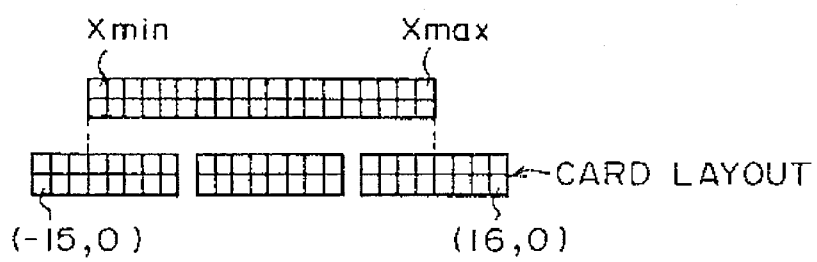

Referring to FIG. 7, the automatic assigning portion 61 comprises an X axis minimum portion 64A, an X axis maximum portion 64B, a Y axis minimum portion 65A, and a Y axis maximum portion 65B. The X axis minimum portion 64A calculates the minimum value in the X axis direction on the wafer map displayed on the display portion 53A. The X axis maximum portion 64B calculates the maximum value in the X axis direction. The Y axis minimum portion 65A calculates the minimum value in the Y axis direction. The Y axis maximum portion 65B calculates the maximum value in the Y axis direction. The X axis minimum value portion 64A and the X axis maximum value portion 64B are connected to an X axis deviation amount (X axis non-contacted chip number) calculating portion 66A. The X axis non-contacted chip number calculating portion 66A calculates the number of non-contacted chips that are disposed outside the semiconductor wafer in the case that the multi-probe card is placed at an edge position thereof. The number of chips that correspond to the length in the X direction of the multi-probe card is denoted by Nx. The number of non-contacted chips at the edge portion of the semiconductor wafer is denoted by Xh. The non-contacted chips on the semiconductor wafer are shown in FIGS. 14B and 15A. In FIG. 15A, the upper row represents a chip row with the maximum width in the X direction. The lower row represents a layout of card assigned position. A left edge start position determining portion 67A is connected to the X direction non-contacted chip number calculating portion 66A. The left edge start position determining portion 67A calculates a left edge start position xs corresponding to the output value of the X direction non-contacted chip number calculating portion 66A so that the number of non-contacted chips on the left becomes almost the same as that on the right. The operation of the left edge start position determining portion 67 is shown in FIG. 15B.

Figure 14C:
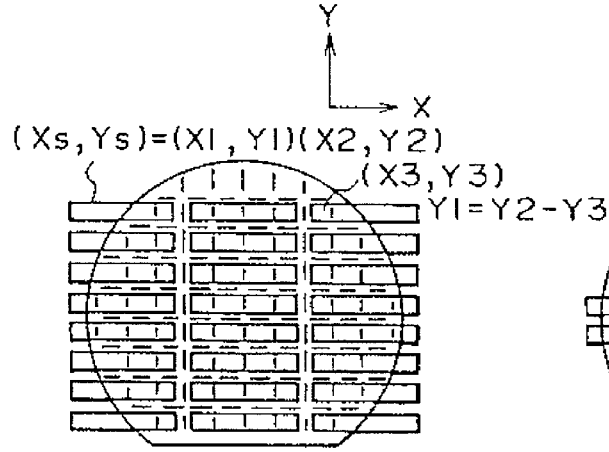

Likewise, a Y direction non-contacted chip number calculating portion 66B is connected to the Y axis minimum value portion 65A and the Y axis maximum value portion 65B. As with the X axis non-contacted chip number calculating portion 66A, the Y axis non-contacted chip number calculating portion 66B calculates the number of non-contacted chips at the edge portions in the Y direction of the semiconductor wafer. The number of non-contacted chips is denoted by Yh. An upper edge start position determining portion 67B is connected to the Y direction non-contacted chip number calculating portion 66B. The upper edge start position determining portion 67B calculates an upper edge start position ys corresponding to the output value of the Y direction non-contacted chip number calculating portion 66B so that the number of non-contacted chips at the upper edge of the semiconductor wafer becomes almost the same as that at the lower edge thereof. An automatic assignment calculating portion 68 is connected to the left edge start position determining portion 67A and the lower edge start position determining portion 67B. The automatic assignment calculating portion 68 automatically assigns the multi-probe card based on the left edge and lower edge of the graphic wafer corresponding to the output values of the start position determining portions 67A and 67B and sends the calculated results to a card assignment storing portion 60. The card assignment storing portion stores the calculated results. FIG. 14C shows a card arrangement according to the calculated results.

Figure 8:
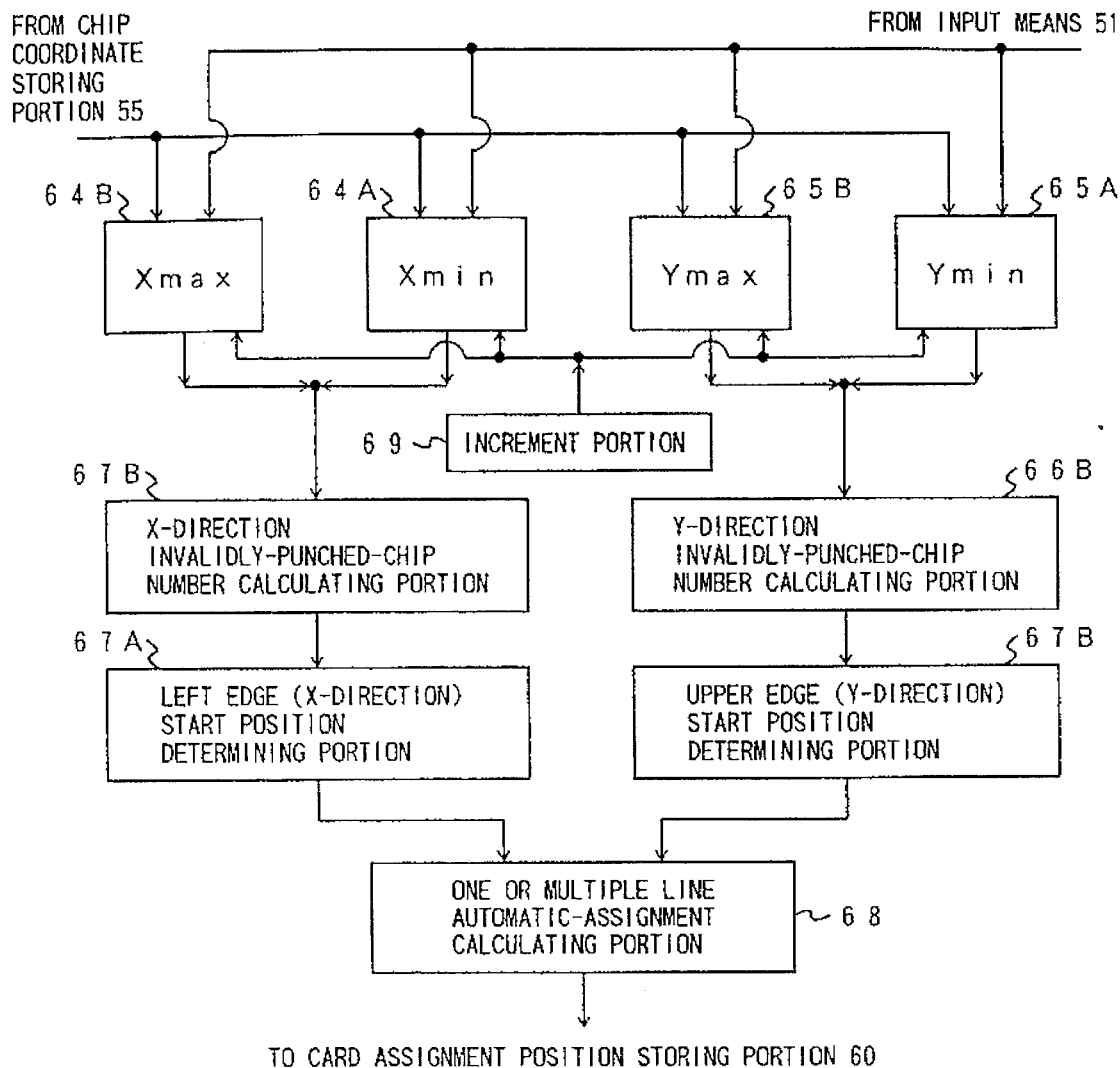
FIG. 8 is a block diagram showing an optimal assigning portion of the computer of FIG. 6.
Figure 14D:
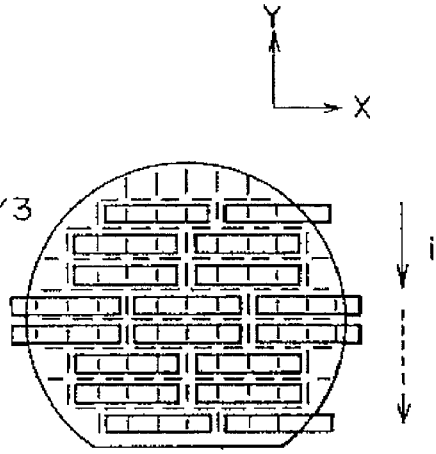

As shown in FIG. 8, the construction of the optimal assigning portion 62 is the same as that of the automatic assigning portion 61 except that the former has an increment portion 69 that is connected to the X axis minimum portion 64A, the X axis maximum portion 64B, the Y axis minimum portion 65A, and the Y axis maximum portion 65B. When the multi-probe card is indexed to a plurality of rows and a plurality of columns of index regions, the optimal assigning portion 62 determines the left edge start position and upper edge start position of each row and each column of the index regions so as to calculate their card assigned positions. At this point, the increment portion 69 displays row(s) to be assigned so as to automatically assign single row or every multiple rows. Thus, the multi-probe card can contact all the chips with the minimum number of contacts (namely, in the minimum contact region). FIG. 14D shows a card arrangement assigned in the minimum contact region.

Figure 9:
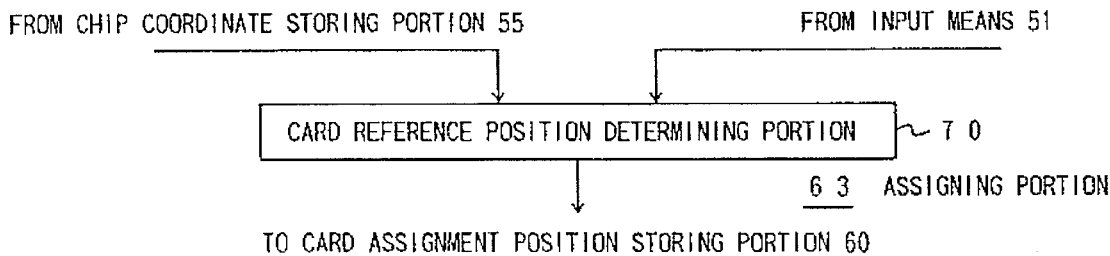
FIG. 9 is a block diagram showing a free assigning portion of the computer of FIG. 6.
Figure 10:
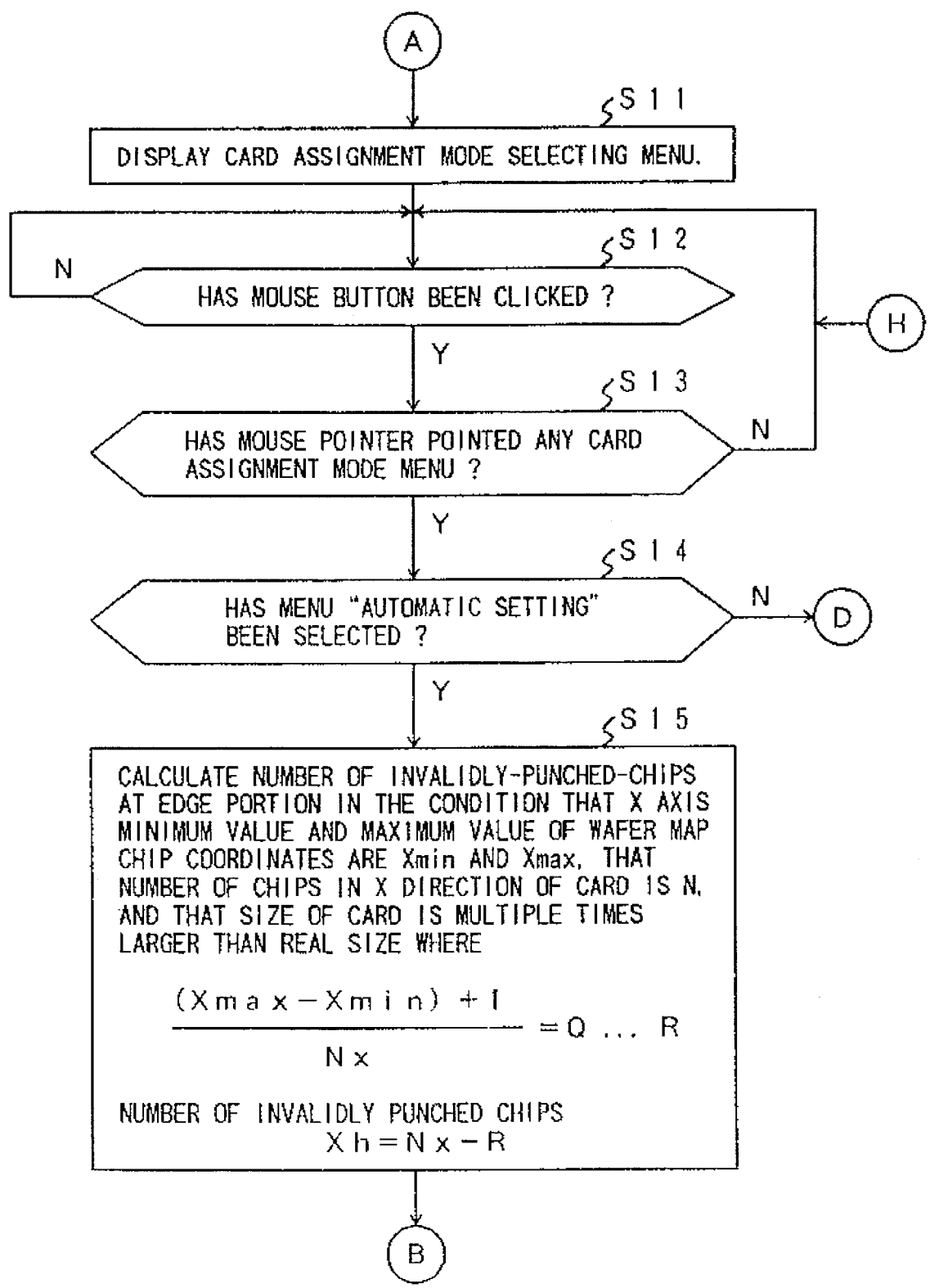
FIG. 10 is a flow chart (first part) showing an assigning operation of a multi-probe card.
Figure 14E:
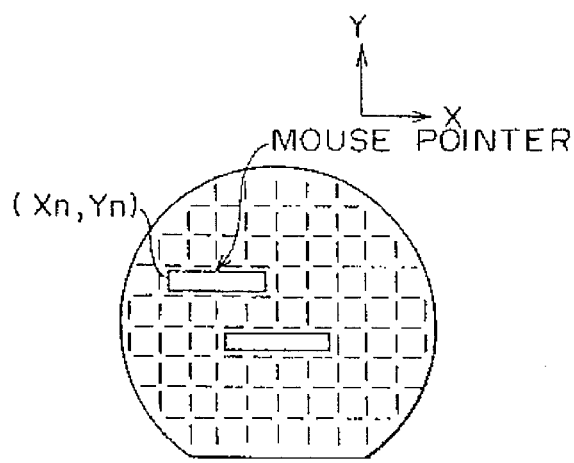

As shown in FIG. 9, the free assigning portion 63 has a card reference position determining portion 70. In the case that the multi-probe card verifies eight chips at the same time, with a reference position of the left edge channel, the position of the channel on the graphic wafer is designated by the mouse 52B as shown in FIG. 14E. Thus, the multi-probe card can be placed at any position on the semiconductor wafer. In other words, the automatic assigning portion 61 and the optimal assigning portion 62 assign the multi-probe card regardless of whether the multi-probe card is placed outside the graphic wafer. In contrast, the free assigning portion 63 allows the operator to freely assign the contact region so that the multi-probe card is disposed on the graphic wafer while observing the display portion 53A.

The card assigned positions and chips that are assigned by the card assigning means 59 are stored as related information in a card assigned position storing portion 60. The card assigned position storing portion 60 stores the number of non-contacted chips and their coordinates. Thus, corresponding to the stored information, the card assigned positions are superimposed with the graphic wafer and graphic chips on the display portion 53A as shown in FIGS. 14C and 14D. The number of non-contacted chips and their coordinates are displayed on the display portion 53A.

Next, with reference to FIGS. 10 to 13, a computer simulation of assigning the contact region of the multi-probe card that verifies every four chips at the same time will be described. As with steps S1 and S2 in the above-described embodiment, the input means 51 inputs wafer information, chip information, and card information. Thus, the coordinate calculating means 54 of the assigning device 52 assigns the chips on the wafer image corresponding to the input information and stores the result. In addition, the coordinate calculating means 54 displays a graphic wafer GW and graphic chips GT corresponding to the wafer and chips on the display portion 53A as shown in FIG. 16. Thereafter, the operator operates the mouse 52B so as to execute the simulation corresponding to flow charts of FIGS. 10 to 13.

At this point, a mode selection menu such as "automatic setting mode", "optimal setting mode", "free setting mode", or the like is displayed at an upper region of the graphic wafer GW on the display portion 53A (at step S11). When a desired one is selected from the three card assigning modes on the display portion 53A, the computer 50 determines whether or not a button of the mouse 52B has been clicked (at step S12). When the bottom of the mouse 52B has been clicked, the computer 50 determines what mode the mouse pointer 71 (see FIG. 16) points at (at step S13). The computer 50 continues this operation until any mode has been selected.

When the automatic setting mode is selected at step S14, the simulation is executed in the following manner. The card assigning means 59 calculates the contact region (layout) of the multi-probe card so that the left portion of the graphic wafer GW assigned to the multi-probe card becomes almost the same as the right portion thereof (at step S15). As the first calculating step, the card assigning means 59 calculates the minimum value Xmin and the maximum value Xmax in the X axis direction of the coordinates of all the chips on the wafer map corresponding to the data stored in the chip coordinate storing portion 55 (see FIG. 14B). Thereafter, the card assigning means 59 calculates the number of non-contacted chips Xh that are placed outside the semiconductor wafer at a wafer edge portion in the case that the number of chips corresponding to the length in the X direction of the multi-probe card, Nx, is 4. The number of non-contacted chips Xh is calculated corresponding to the following expression. The calculated result is shown in FIG. 15A. The reason why 1 is added to the difference between Xmax and Xmin is in that a chip at coordinates (0, 0) is added. Thereafter, the flow advances to step S16. In the following expression, Q represents the quotient of the division and R represents the remainder thereof.

$$\{(X\text{max}-X\text{min})+1\}/Nx=Q \ldots R$$

Number of non-contacted chips $Xh=Nx-R$

When real values are substituted into the expression, the number of non-contacted chips Xh is obtained.

$$\{(12-(-12)+1\}/8=3 \ldots 1$$

Number of non-contacted chips $Xh=8-1=7$

The left edge start position xs of the layout of the multi-probe card in the X axis direction is calculated corresponding to the following equation at step S16. In other words, the multi-probe card is laid out corresponding to the following equation so that the amount of deviation of the multi-probe card that is placed outside the wafer (namely, the number of non-contacted chips) at one edge in the X direction becomes almost the same as that at the other edge thereof.

$$xs=X\text{min}-[Xh/2]$$

wherein [Xh/2] is an integer that has been rounded off.

When real values are substituted in the equation, the multi-probe card is laid out as shown in FIG. 15B.

$$xs=-12-[7/2]=-15$$

In other words, the coordinates (−15, 0) become the start position of the layout of the multi-probe card. From the left edge of the wafer, three chips are placed outside the wafer. From the right edge of the wafer, four chips are placed outside the wafer. It should be noted that the layout may be started from the right edge.

Likewise, the layout of the multi-probe card is preformed in the Y direction at step S17. First, the upper edge start position ys on the Y axis is calculated. After the start coordinates (xs, ys) on the wafer map have been calculated, the upper left portion of the multi-probe card is placed at the coordinates (xs, ys) (namely, the channel at the upper left edge because there are two rows in the Y direction). Based on the start coordinates of the wafer map, the multi-probe card is assigned in the X direction (row direction) and the Y direction (column direction). The result that is the contact region is displayed on the display portion 53A (at step S18). FIG. 14C shows the result. The calculated result is stored in the card assigned position storing portion 60 (at step S19) and finally stored in the file storing portion 56 (at step S20).

Next, the optimal setting mode will be described. In this mode, the card assigned positions are automatically laid out so that the number of contacts of the multi-probe card 1, namely the number of times of the indexing operation thereof, becomes minimum. In other words, the flow returns to step S14. When the determined result at step S14 is NO, the flow advances to step S21 shown in FIG. 12. The content stored in the increment portion 69 is set to "0" (at step S22). Thereafter, the content i stored in the increment portion 69 is incremented by 1 (at step S23).

Figure 11:
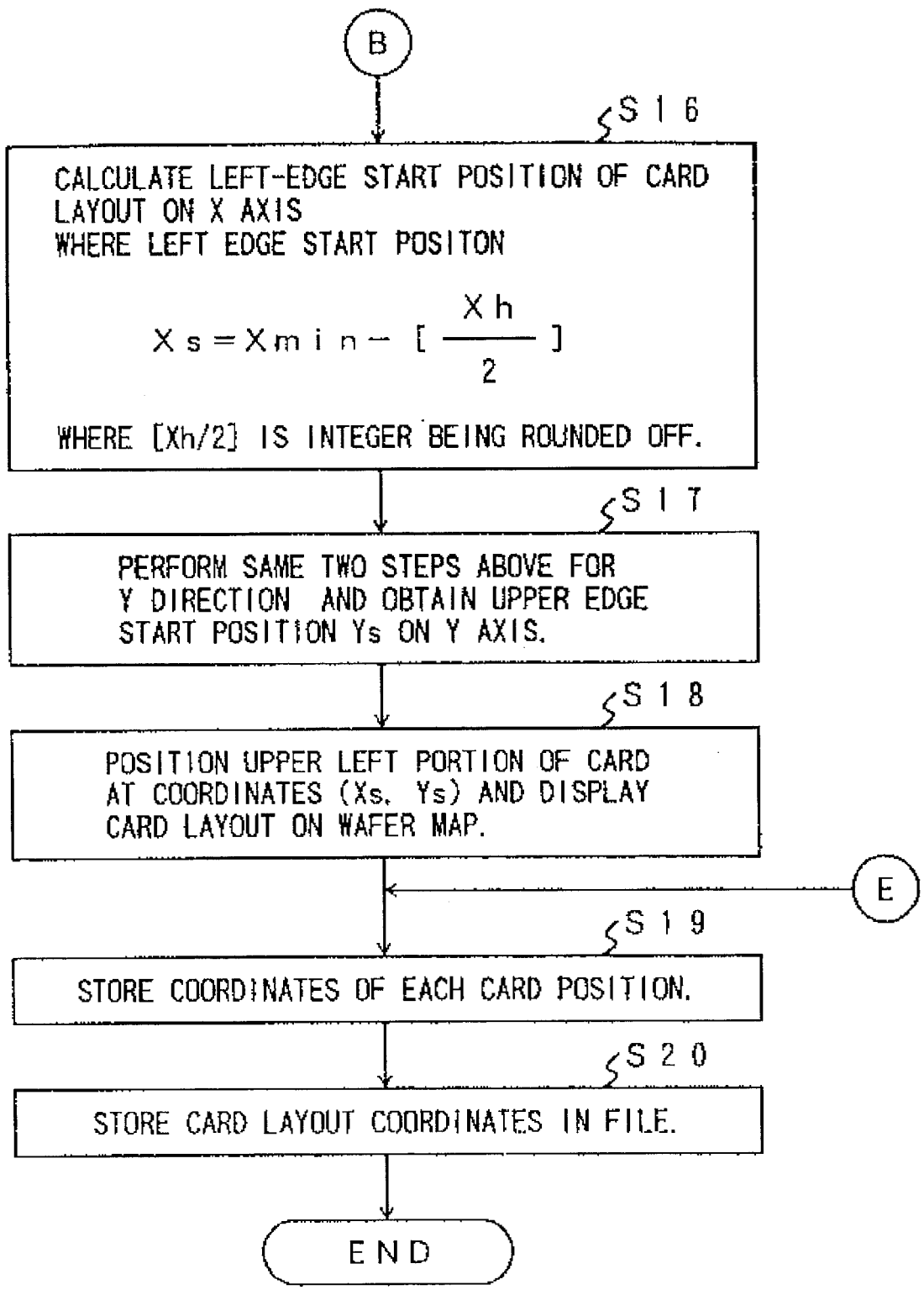
FIG. 11 is a flow chart (second part) showing the assigning operation of the multi-probe card.
Figure 12:
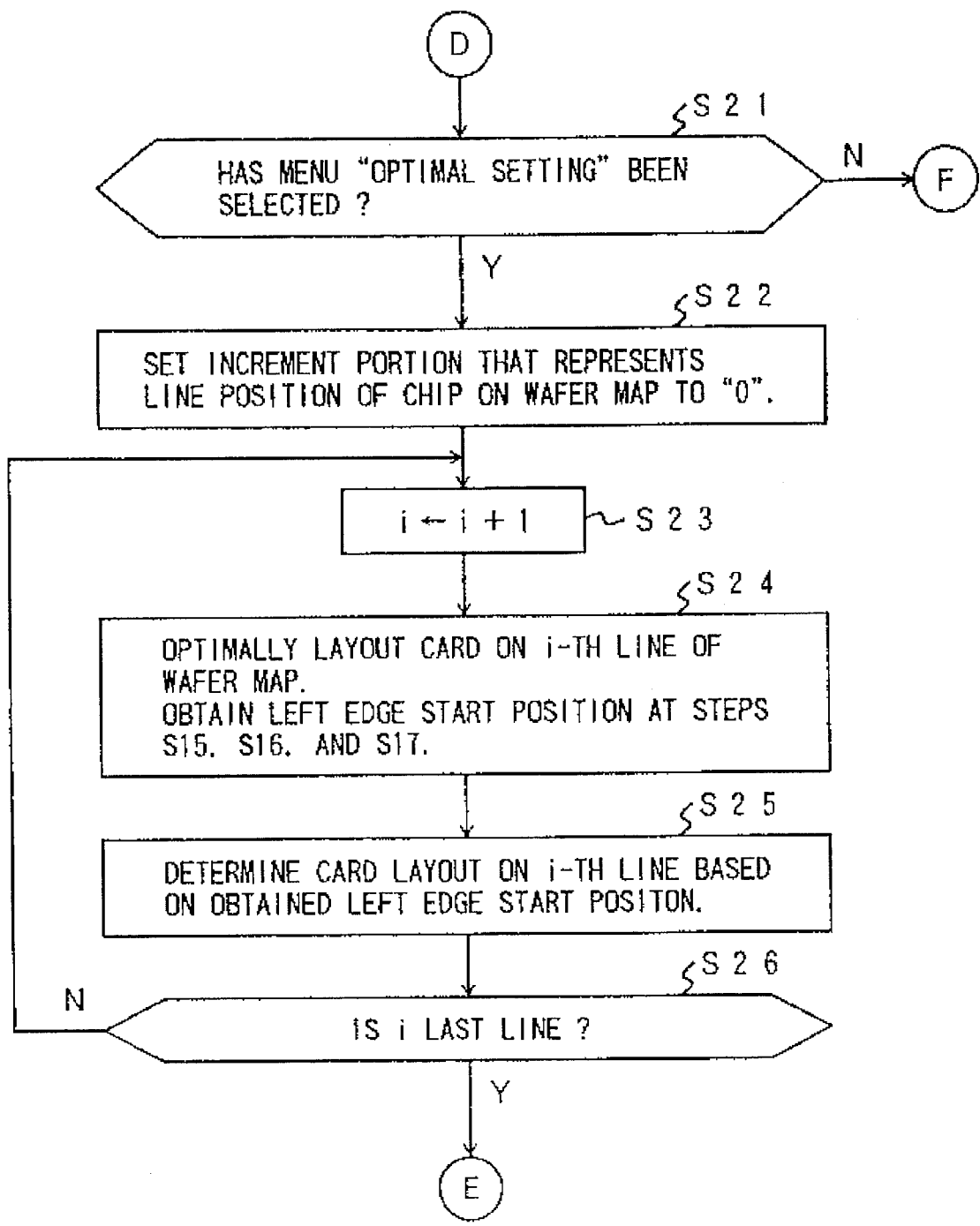
FIG. 12 is a flow chart (third part) showing the assigning operation of the multi-probe card.
Figure 13:
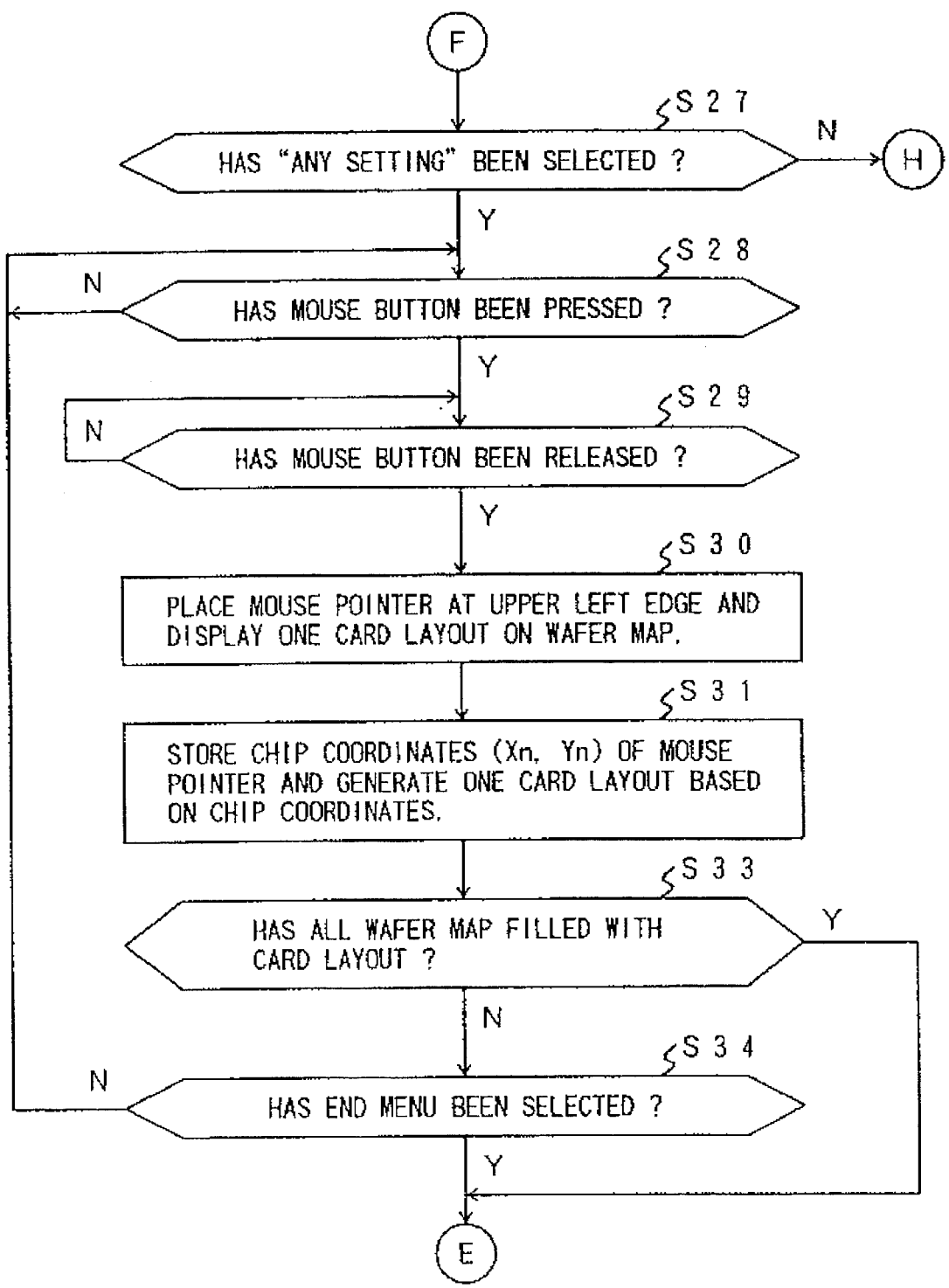
FIG. 13 is a flow chart (fourth part) showing the assigning operation of the multi-probe card.

Thereafter, at i-th row (first row in this example) on the wafer map, the multi-probe card is optimally laid out so as to design the contact region. In this case, the steps S15 of FIG. 10 and the steps S16 and S17 of FIG. 11 are performed for the first row so as to calculate the left edge position (at step S24). Thereafter, based on the left edge position, the layout of the multi-probe card on the first row is determined. The layout of the multi-probe card on the first row is displayed on the display portion 53A (at step S25). Thereafter, it is determined whether or not the i-th row is the last row of the wafer map (at step S26). When the determined result is NO, the flow returns to step S23. At step S23, the content i stored in the increment portion 69 is incremented by 1 and the same operations are repeated. When the determined result at step S26 is YES, the flow advances to step S19 shown in FIG. 11. At step S19, each contact region of the multi-probe card being laid out is stored. Each contact region of the multi-probe card is shown in FIG. 14D. Thus, the multi-probe card is laid out so that the number of times of the indexing operation thereof becomes minimum.

Last, the case that the "free setting mode" is selected will be described. In the "free setting mode", the operator assigns the multi-probe card to a desired position so as to set the contact region. At step S27 shown in FIG. 13, when "free setting" is selected, it is determined whether or not a mouse button has been pressed (at steps S28 and S29). When the mouse button has been released, the upper left edge of the layout of the multi-probe card is placed at the chip coordinates (xn, yn) of the mouse pointer 71 and one layout is displayed (at step S30). The chip coordinates of the mouse pointer 71 are stored (at step S32). Thereafter, it is determined whether or not the wafer map is filled with the layout of the multi-probe card (at step S33). When the determined result is NO, it is determined whether or not the "end menu" has been selected (at step S34). When the "end menu" has not been selected, the flow returns to step S28. From step S28, the above-described operations are repeated. FIG. 14E shows a layout of the multi-probe card that is displayed on the display portion 53A. When the wafer map has been filled with the layout of the multi-probe card or the end menu has been selected, the flow returns to step S19 shown in FIG. 11. At step S19, the coordinates of the position of the multi-probe card are stored as a file.

When the contact region 22 is calculated by the probing method according to this embodiment, any of the above-described three modes can be used. When the multi-number and the arrangement of the multi-probe card have been determined, the minimum contact region 22 can be quickly obtained in the optimal setting mode. However, in the minimum contact region 22, the number of non-contacted chips is not always minimum. Thus, to assign the contact region 22 with the minimum number of non-contacted chips, the operator should select a proper mode corresponding to the simulated results of the three modes. The proper mode can be determined by the computer 50. In this case, it is necessary to use determining software and to input various optimal conditions thereto.

In addition, the multi-number and layout of the multi-probe card can be assigned by the computer 50. In this case, various semiconductor wafers to be verified should have been input to the file storing portion. By inputting various multi-probe card information for the semiconductor wafers and selecting a proper multi-probe card with the highest efficiency corresponding to the result, an optimal multi-probe card can be obtained.

In the above-described embodiments, the present invention was explained for the cases that (8×2) chips T and (4×2) chips T are verified at the same time. However, it should be noted that the present invention is not limited to such cases. According to the present invention, a multi-probe card is used. The multi-probe card has a plurality of contacts corresponding to chips disposed in such a manner that an even number of chips are arranged both in vertical and horizontal directions, the number of chips in at least one of the vertical and horizontal directions is four or more. A plurality of chip regions verified by the multi-probe card are defined as an index region. A plurality of index regions are defined on the semiconductor wafer so that they cover all chips thereon. The minimum region of the index regions that covers all the chips is defined as a contact region. The multi-probe card is indexed in the shortest path from a predetermined index region in the contact region to the last index region. In addition, the present invention can be applied to the case that a wafer and chips are displayed on a CRT, an LCD, or the like by a computer and a contact region is designed on the display portion. Moreover, in the above embodiments, the multi-probe card was an upright probe card that has contacts. However, according to the present invention, a membrane card may be used.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor wafer probing method for contacting a plurality of probe needles of a probe card to a plurality of electrode pads of a plurality of chips on a semiconductor wafer so as to verify electrical characteristics of the chips, said method comprising the steps of:

preparing a multi-probe card having a first plurality of probe needles corresponding to a first plurality of chips that are disposed in such a manner that an even number of chips are successively arranged in both row and column directions, the number of chips in at least one of the row and column directions being at least four;

assigning as one index region, a region corresponding to a portion of the wafer wherein all the chips of the first plurality of chips can be verified by the multi-probe card at the same time;

arranging a second plurality of the index regions so that the second plurality of index regions cover all the chips on the semiconductor wafer, and minimize the number of times the probe needles would not contact with a chip during verification of all chips corresponding to all index regions;

defining a contact region made up of all of the index regions; and successively transferring the semiconductor wafer for contact between the probe needles and the electrode pad of each chip corresponding to each index region of the contact region.

2. The semiconductor wafer probing method as set forth in claim 1, wherein said transferring step includes transferring the semiconductor wafer from a first index region to a last index region in a shortest path.

3. A semiconductor wafer probing method for contacting a plurality of probe needles of a probe card to a plurality of electrode pads of a plurality of chips on a semiconductor wafer at the same time so as to verify electric characteristics of the chips, comprising the steps of:

preparing a multi-probe card having a first plurality of probe needles corresponding to a first plurality of chips that are disposed in such a manner that an even number of chips are successively arranged in both row and column directions, the number of chips in at least one of the row and column directions being at least four;

causing a display unit of a computer to display the semiconductor wafer and all the chips;

assigning as one index region, on the display unit, a region where all of the first plurality of chips can be verified by the multi-probe card at the same time;

arranging a second plurality of the index regions so that the index regions cover all the chips on the semiconductor wafer, and minimize the number of times the probe needles would not contact with a chip during verification of all chips corresponding to all index regions;

defining a contact region on the display unit, the contact region being made up of all the index regions; and successively transferring the semiconductor wafer for contact between the probe needles and the electrode pad of each chip corresponding to each index region of the contact region.

4. The semiconductor wafer probing method as set forth in claim 3, wherein said transferring step includes transferring the semiconductor wafer to the contact region from a first index region to a last index region in a shortest path.

5. A semiconductor wafer probing method for contacting a plurality of probe needles of a probe card to a plurality of electrode pads of a plurality of chips on a semiconductor wafer so as to verify electrical characteristics of the chips, said method comprising the steps of:

inputting semiconductor wafer information and chip information to a computer;

inputting information of a multi-probe card having a first plurality of probe needles corresponding to a first plurality of chips to the computer;

assigning as an index region, a region corresponding to a portion of the wafer wherein all of the chips of the first plurality of chips can be verified by the multi-probe card;

displaying index regions on a display unit;

using the computer to simulate a contact region defined by a second plurality of index regions that cover all of the chips on the semiconductor wafer;

calculating the number of times the probe needles would not contact with a chip during verification of all the chips corresponding to all of the index regions;

determining coordinates of the locations on the wafer where the probe needles would not contact with a chip from the results of the simulation and storing the results of the calculating step in the computer; and determining whether or not the number of transferring operations and the number of locations are proper based the information stored in the computer.

6. The semiconductor wafer probing method as set forth in claim 5, wherein said simulating step includes automatically assigning the index regions corresponding to a predetermined rule.

7. The semiconductor wafer probing method as set forth in claim 5, wherein said simulating step includes optimally assigning the index regions so that the number of index regions becomes minimum.

8. The semiconductor wafer probing method as set forth in claim 5, wherein said simulating step includes freely assigning the index regions.

9. The semiconductor wafer probing method as set forth in claim 6, wherein said automatically assigning step includes assigning the index regions so that the number of locations at one edge of a plurality of index regions disposed in a row becomes almost the same as that at the other edge thereof.

10. The semiconductor wafer probing method as set forth in claim 6, wherein said optimally assigning step includes assigning the index regions so that the number of locations at each of both edges of a plurality of index regions disposed in a row becomes minimum.

* * * * *